United States Patent
Chretien et al.

(10) Patent No.: US 7,749,300 B2
(45) Date of Patent: Jul. 6, 2010

(54) PHOTOCHEMICAL SYNTHESIS OF BIMETALLIC CORE-SHELL NANOPARTICLES

(75) Inventors: Michelle N. Chretien, Mississauga (CA); Yiliang Wu, Mississauga (CA); Naveen Chopra, Oakville (CA)

(73) Assignee: Xerox Corporation, Norwalk, CT (US)

( * ) Notice: Subject to any disclaimer, the term of this patent is extended or adjusted under 35 U.S.C. 154(b) by 156 days.

(21) Appl. No.: 12/133,548

(22) Filed: Jun. 5, 2008

(65) Prior Publication Data

US 2009/0301344 A1 Dec. 10, 2009

(51) Int. Cl.
*B22F 9/18* (2006.01)

(52) U.S. Cl. .............................. 75/371; 75/373; 75/374; 977/777

(58) Field of Classification Search .................... 75/371, 75/373, 374; 977/777
See application file for complete search history.

(56) References Cited

U.S. PATENT DOCUMENTS

| | | | |
|---|---|---|---|
| 6,887,297 | B2 | 5/2005 | Winter et al. |
| 7,608,204 | B2 * | 10/2009 | Kim et al. .................... 252/512 |
| 2003/0180451 | A1 | 9/2003 | Kodas et al. |
| 2004/0175548 | A1 | 9/2004 | Lawrence et al. |
| 2005/0078158 | A1 | 4/2005 | Magdassi et al. |
| 2006/0053972 | A1 | 3/2006 | Liu et al. |
| 2007/0212562 | A1 | 9/2007 | Shim et al. |

FOREIGN PATENT DOCUMENTS

| | | |
|---|---|---|
| JP | 2007169763 A * | 7/2007 |
| JP | A-2007-169763 | 7/2007 |

OTHER PUBLICATIONS

Machine translation of JP 2007-169763 published Jul. 5, 2007.*
Dhas, N. Arul et al. "Synthesis, Characterization, and Properties of Metallic Copper Nanonparticles", *Chem Mater.*, vol. 10, pp. 1446-1452, 1998.
Volkman, Steven K. et al. "Ink-jetted Silver/Copper conductors for printed RFID applications", *Mat. Res. Soc. Symp. Proc.*, vol. 814, pp. 17.8.1-17.8.6, 2004.
Jana, Nikhil R. et al. "Seed-mediated growth method to prepare cubic copper nanoparticles", *Current Science*, vol. 79, No. 9, pp. 1367-1370, Nov. 10, 2000.
Wu, Chunwei et al. "Simple One-Step Synthesis of Uniform Disperse Copper Nanoparticles", *Mater. Res. Soc. Symp. Proc.*, vol. 879 E, pp. Z6.3.1-Z6.3.6, 2005.
Chen, Ming et al. "Phase transition of silver nanoparticles from aqueous solution to chloroform with the help of inclusion complexes of *p*-sulfonated calix[4]arene and alkanethiol molecules and its application in the size sorting of nanoparticles", *Nanotechnology*, vol. 18, 175706, pp. 1-7, 2007.
McGilvray, Katherine et al. "Facile Photochemical Synthesis of Unprotected Aqueous Gold Nanoparticles", *J. Am. Chem. Soc.*, vol. 128, No. 50, pp. 15980-15981, 2006.
Kapoor, S. et al. "Photochemical formation of copper nanoparticles in poly(*N*-vinylpyrrolidone)", *Chemical Physics Letters*, vol. 370, pp. 83-87, 2003.
Yonezawa et al., "Photochemical formation of colloidal silver: Peptizing action of acetone ketyl radical," *J. Chem. Soc. Faraday Trans.*, vol. 87, p. 1905 (1991).
U.S. Appl. No. 12/126,581, filed May 23, 2008, to Michelle Chretien et al.
Sep. 25, 2009 European Search Report issued in Application No. EP 09 16 0745.
Dong et al., "Photochemical synthesis of bimetallic Au-Ag nanoparticles with "core-shell" type structure by seed mediated catalytic growth", Trans. Nonferrous Met. Soc. China, vol. 15, No. 2, Apr. 2005, pp. 310-313.
Condorelli et al., "A single photochemical route for the formation of both copper nanoparticles and patterned nanostructured films", J. Mater. Chem., vol. 13, Sep. 4, 2003, pp. 2409-2411.

* cited by examiner

*Primary Examiner*—George Wyszomierski
*Assistant Examiner*—Tima M McGuthry-Banks
(74) *Attorney, Agent, or Firm*—Oliff & Berridge, PLC

(57) ABSTRACT

A method of forming bimetallic core-shell metal nanoparticles including a core of a first metal material and a shell of a second metal material, the method including photochemically producing metallic nanoparticle cores of the first metal material, and forming a shell of the second metal material around the cores. The shell can be formed by adding shell-forming precursor materials to a solution or suspension of the cores and photochemically forming the shells around the cores, or by separately photochemically producing metallic nanoparticles of the second metal material and mixing the metallic nanoparticles of the second metal material and the metallic nanoparticle cores to cause the metallic nanoparticles of the second metal material to form a shell around the metallic nanoparticle cores.

18 Claims, No Drawings

PHOTOCHEMICAL SYNTHESIS OF BIMETALLIC CORE-SHELL NANOPARTICLES

CROSS-REFERENCE TO RELATED APPLICATIONS

Disclosed in commonly assigned U.S. patent application Ser. No. 12/126,581, filed May 23, 2008, to Michelle Chretien et al., is a method of forming an ink, comprising: photochemically producing stabilized metallic nanoparticles; and formulating the nanoparticles into an ink.

The entire disclosure of the above-mentioned application is totally incorporated herein by reference.

TECHNICAL FIELD OF THE DISCLOSURE

The present disclosure relates to a method of photochemically producing bimetallic core-shell nanoparticles, which can be used, for example, in ink applications.

BACKGROUND

Printed electronic features, such as thin film transistor (TFT) electrodes, conductive line, trace, pad, and interconnect for integrated circuits, and radio frequency identification (RFID) technology, are an area of intensive research. The ability to directly print electronic features opens the door to a myriad of low-cost flexible electronics with many possibilities for application.

Materials commonly used for printing electronic conductive features include metal materials. In particular, nanoparticulate metal materials are widely-used in printed electronics applications because they have superior characteristics that yield a better product. Metallic nanoparticles are particles having a diameter in the submicron size range. Nanoparticle metals have unique properties, which differ from those of bulk and atomic species. Metallic nanoparticles are characterized by enhanced reactivity of the surface atoms, high electric conductivity, and unique optical properties. For example, nanoparticles have a significantly lower melting point than bulk metal, and a lower sintering temperature than that of bulk metal. The unique properties of metal nanoparticles result from their distinct electronic structure and from their extremely large surface area and high percentage of surface atoms.

Metallic nanoparticles are either crystalline or amorphous materials. They can be composed of pure metal, such as silver, gold, copper, etc., or a mixture of metals, such as alloys, or a core of one or more metals such as copper covered by a shell of one or more other metals such as gold or silver. Nickel has been used for conductive inks for a very limited extent because of its relatively low conductivity (approximately four times less than that of copper or silver). Gold and silver can provide good conductivity, but are relatively expensive. Moreover, gold and silver require high temperatures for annealing, which can pose a challenge for printing on paper and plastic substrates. Copper provides good conductivity at a low price (about one percent of that of silver). Unfortunately, copper is easily oxidized and the oxide is non-conductive. Conventional copper-based nanoparticle inks are unstable and require an inert/reducing atmosphere during preparation and annealing in order to prevent spontaneous oxidation to non-conductive CuO or $Cu_2O$. Copper polymer thick film inks have been available for many years and can be used for special purposes, for example, where solderability is required. Another interesting strategy is to combine the advantages of both silver and copper. Silver plated copper particles are commercially available, and are used in some commercially available inks. Silver plating provides the advantages of silver for inter-particle contacts, while using the less-expensive conductive metal (copper) for the bulk of the particle material. However, as discussed above, silver is relatively expensive, and using a plating method to obtain core-shell structures is not cost-effective. Thus, there is a need for a reliable, cost-effective method for producing inks that are suitable for printing electronic features.

REFERENCES

U.S. Patent Application Publication No. 2007/0212562 A1 to Shim et al. describes metal nanoparticles containing a copper core and a thin layer of precious metals enclosing the core to prevent oxidization of the copper. The reference describes that manufacturing the metal nanoparticles is economically efficiency because of increased copper content and because such metal nanoparticles contain a metal having high electrical conductivity such as silver for a thin layer. The reference describes that the metal nanoparticles can form a wiring having better conductivity than copper and there is little concern that silver migration may occur.

U.S. Patent Application Publication No. 2004/0175548 A1 to Lawrence et al. describes a conductive ink that is suitable for gravure or flexographic printing and includes a carboxylic acid or anhydride-functional aromatic vinyl polymer and an electrically conductive material that may be either a particulate material or a flake material, particularly a conductive flake material having an aspect ratio of at least about 5:1.

Dhas et al., *Chem Mater,* 10:1446-52 (1998) discusses a method for metallic copper nanoparticle synthesis by using an argon/hydrogen (95:5) atmosphere in order to avoid formation of impurities, such as copper oxide.

Volkman et al., *Mat. Res. Soc. Proc.,* 814:17.8.1-17.8.6 (2004) describes processes for forming silver and copper nanoparticles, and discusses the optimization of the printing/annealing processes to demonstrate plastic-compatible low-resistance conductors.

Jana et al., *Current Science,* 79(9):1367-70 (Nov. 10, 2000) describes preparation of cubic copper particles, in which cube-shaped copper nanoparticles in the size range of about 75 to 250 nm are formed from smaller spherical copper particles.

Wu et al., *Mater. Res. Soc. Symp. Proc.,* 879E:Z6.3.1-Z6.3.6 (2005) describes a solution-phase chemical reduction method with no inert gas protection for preparing stable copper nanoparticle colloid with average particle size of 3.4 nm and narrow size distribution using ascorbic acid as both a reducing agent and an antioxidant to reduce copper sale precursor and effectively prevent the general oxidation process occurring to the newborn nanoparticles.

Chen et al., *Nanotechnology,* 18:175706-12 (2007) describes silver nanoparticle synthesis in aqueous solution and capped with an inclusion complex of octadecanethiol and p-sulfonated calix[4]arene.

McGilvray et al., *J. Am. Chem. Soc.,* 128(50):15980-81 (2006) describes a photochemical synthesis of stable, unprotected gold nanoparticles that does not require conventional stabilizing ligands, such as sulfur, nitrogen or phosphorous.

Kapoor et al., *Chem. Phys. Letters,* 370:83-7 (2003) describes preparation of copper nanoparticles by photo-reduction of $CuSO_4$ and with 253.7 nm UV light in the presence of poly(N-vinylpyrrolidone) and benzophenone. Kapoor et al. describe that in the formation of Cu nanoparticles, the ketyl radical of benzophenone does not participate.

Yonezawa et al., "Photochemical formation of colloidal silver: Peptizing action of acetone ketyl radical," *J. Chem. Soc., Faraday Trans.*, Vol. 87, p. 1905 (1991) describes photochemical formation of metal nanoparticles using acetone ketyl radicals in micelles U.S. Patent Application Publication No. 2006/0053972 A1 to Liu et al. describes a process for producing copper nanoparticles in the form of a solid powder by first reacting an aqueous solution containing a reductant with an aqueous solution of a copper salt, followed by adding an apolar organic solution containing the extracting agent, and then post-treating the reaction product to obtain copper nanoparticles.

U.S. Patent Application Publication No. 2005/0078158 A1 to Magdassi et al. describes compositions for use in inkjet printing onto a substrate via a water-based dispersion including metallic nanoparticles and appropriate stabilizers. Magdassi also describes methods for producing such compositions and methods for their use in ink jet printing onto suitable substrates.

U.S. Pat. No. 6,887,297 to Winter et al. describes methods of making monodisperse nanocrystals via reducing a copper salt with a reducing agent, providing a passivating agent including a nitrogen and/or an oxygen donating moiety, and isolating the copper nanocrystals. Winter also describes methods for making a copper film via the steps of applying a solvent including copper nanocrystals onto a substrate and heating the substrate to form a film of continuous bulk copper from the nanocrystals. Winter also describes methods for filling a feature on a substrate with copper via the steps of applying a solvent including copper nanocrystals onto the featured substrate and heating the substrate to fill the feature by forming continuous bulk copper in the feature.

U.S. Patent Application Publication No. 2003/0180451 to Kodas et al. discloses a precursor composition for the deposition and formation of an electrical feature such as a conductive feature. The precursor composition advantageously has a low viscosity enabling deposition using direct-write tools. The precursor composition also has a low conversion temperature. A particularly preferred precursor composition includes copper metal for the formation of highly conductive copper features.

The above-described methods for creating metallic nanoparticle inks suffer from several drawbacks. The requirements for preparing metallic nanoparticles for incorporation in inks that are suitable for printing electronic features are: stability under atmospheric conditions, small particle size, cost-effectiveness and high throughput yield. However, methods for creating gold and silver nanoparticles are relatively costly. Moreover, when copper is used, most methods require a reducing/inert atmosphere to avoid oxidation of the copper particles. The methods described that do not require a reducing/inert atmosphere suffer from the limitations that the particles formed are too large to be annealed at a lower temperature (<200° C.). Therefore, a high annealing temperature requirement may prohibit printing on paper and plastic substrates. Alternatively, the methods produce low yields. Thus, there exists a need for a method of producing inks that meet these requirements and can be more easily and cost-effectively produced and used.

The appropriate components and process aspects of each of the foregoing may be selected for the present disclosure in embodiments thereof, and the entire disclosures of the above-mentioned references are entirely incorporated herein by reference.

SUMMARY

The present disclosure provides a method of forming bimetallic core-shell metal nanoparticles having a core of a first metal material and a shell of a second metal material, where the bimetallic core-shell metal nanoparticles are made by photochemically producing metallic nanoparticle cores of the first metal material; and forming a shell of the second metal material around the cores. The shell can be formed, for example, by adding shell-forming precursor materials to a solution or suspension of the cores and photochemically forming the shells around the cores, or by separately photochemically producing metallic nanoparticles of the second metal material, wherein the metallic nanoparticles of the second metal material have a smaller average particle size than the metallic nanoparticle cores, and mixing the metallic nanoparticles of the second metal material and the metallic nanoparticle cores to cause the metallic nanoparticles of the second metal material to form a shell around the metallic nanoparticle cores.

The present disclosure also provides a method of forming ink compositions, using such bimetallic core-shell metal nanoparticles. The ink may be formed, for example, by photochemically producing the bimetallic core-shell nanoparticles and formulating the nanoparticles into an ink. The ink may be printed onto a substrate. The printed ink may be annealed.

The advantages of the present disclosure are numerous. The ink including the metallic nanoparticles may be annealed at a lower temperature than the conventional annealing temperature. Therefore, the ink can be printed on a wide variety of substrates, including paper and plastic substrates. The method is also fast, and thus large quantities of nanoparticles can be produced rapidly, in a matter of seconds to a few minutes. The method is also versatile. Because cores and shells of different metal materials and different sizes can be used, the nanoparticles can be adjusted such that upon annealing, the core remains solid while the shell forms a continuous conductivity path, thus allowing, for example, for the use of cheaper copper nanoparticle cores but better conductivity paths of precious metals. Therefore, this method offers a cheaper alternative to synthesis of bimetallic nanoparticles than using expensive metals in bulk form, such as platinum, gold or silver. The size and/or concentration of the nanoparticles can be easily controlled by changing one or more of the parameters of this method, such as irradiation time, irradiation intensity, the metal counter-ion used, and/or the concentrations of the metal or the photoinitiator. Finally, the method is ecologically-friendly because it does not require harsh reducing agents, and can be performed at room temperature with water.

EMBODIMENTS

This disclosure is not limited to particular embodiments described herein, and some components and processes may be varied by one of ordinary skill in the art, based on this disclosure. The terminology used herein is for the purpose of describing particular embodiments only, and is not intended to be limiting.

In this specification and the claims that follow, singular forms such as "a," "an," and "the" include plural forms unless the content clearly dictates otherwise.

Generally, the present disclosure provides a method of forming bimetallic core-shell nanoparticles, and a method for forming an ink comprising such bimetallic core-shell nanoparticles. Generally, the ink may be printed onto a substrate and also may be annealed. The methods are now described in further detail below.

In embodiments, the bimetallic core-shell nanoparticles are made by first producing metallic nanoparticles of a first metal material, referred to herein as "cores," by a photochemical method. Next, shells are formed around the cores by depositing a second metal material onto the cores. The shell can be formed, for example, by adding shell-forming precursor materials to a solution or suspension of the cores, and then photochemically forming the shells around the cores, or by separately photochemically producing smaller sized metallic nanoparticles of the second metal material, and mixing the metallic nanoparticles of the second metal material and the metallic nanoparticle cores to cause the metallic nanoparticles of the second metal material to form a shell around the metallic nanoparticle cores. In embodiments, the first metal material and second metal material are different, but they can also be the same.

Synthesis of the Metallic Nanoparticle Cores

Generally, metallic nanoparticles that are suitable as core particles for the bimetallic core-shell nanoparticles may be produced in any suitable medium, such as an aqueous solution or other solvent that solubilizes the metal salt, by reduction of one or more metallic ions with a reducing agent. The solution, such as an aqueous solution, may be deaerated, in embodiments. Use of deaerated solutions is particularly desirable, for example, where the nanoparticles being formed are of a size (average particle diameter) or metal material that would be easily oxidized to render the particles non-conductive.

The metallic ions are provided as metal salts. Suitable metallic ion provided as metal salts include ions of copper, aluminum, magnesium, manganese, zinc, chromium, lead, cadmium, cobalt, nickel, gold, silver, platinum, tin, palladium, indium, iron, tungsten, molybdenum, ruthenium, bismuth, other suitable metal ions, and mixtures thereof. For example, the metal salt can be provided in the form of metal sulfates, metal halides (such as metal chlorides or metal bromides), metal nitrates, metal acetates, metal nitrites, metal oxides, metal carbonates, metal hydroxides, metal oxalates, metal pyrazolyl borates, metal azides, metal fluoroborates, metal carboxylates, metal halogencarboxylates, metal hydroxycarboxylates, metal aminocarboxylates, metal aromatic and nitro and/or fluoro substituted aromatic carboxylates, metal aromatic and nitro and/or fluoro substituted aromatic carboxylates, metal beta diketonates, metal sulfonates, metal acetylacetonate and the like. As used herein, the core is described as formed of a first "metal material" to clearly indicate that the core can be of a single elemental metal, such as copper, or it can be a mixture or alloy of two or more different metals.

In one embodiment, the metal ions are provided as copper (I) ions. The copper (II) ions can be incorporated into metal salts such as, for example, copper sulfate, copper chloride, copper nitrate, or copper acetate. Of course, other metals, and other metal salts, can also be used.

As the reducing agent, one or more photochemically generated radicals may be used. The radicals react with one or more metal cations ($M^+$, $M^{2+}$, etc., wherein M represents a suitable metal), to produce unprotected metal $M^0$ nanoparticles. Suitable reducing agents include, for example, a radical. Examples of suitable radicals include, for example, a ketyl or an α-amino radical or any other radical species having the necessary redox potential and sufficient lifetime for reactivity. The radicals used according to the present disclosure may be provided from any known source, including commercially available sources. In one embodiment, the radicals are produced by Norrish Type I cleavage of α-hydroxy or α-aminoketones. Such radical sources are also commercially available as, for example, Ciba commercial photoinitiators IRGACURE® 184, 127, 2959, 369, 379, etc. In another embodiment, the radicals are produced by a Norrish Type II photoinitiation process, in which a photoexcited ketone (such as, for example, benzophenone) abstracts a proton from a proton donor molecule (such as, for example, isopropanol) to generate two ketyl radicals.

In embodiments, the for example, aqueous, solution of metallic nanoparticles and the reducing agent are irradiated for from about 5 seconds to about 90 seconds, such as from about 10 to about 45 seconds or from about 15 to about 30 seconds. The intensity of irradiation is from about 0.001 $W/cm^2$ to about 10 $W/cm^2$, such as from about 0.05 $W/cm^2$ to about 5 $W/cm^2$, or from about 0.1 $W/cm^2$ to about 1 $W/cm^2$. The source of irradiation may generally be any source known in the art, such as, for example, by UV or visible radiation. This results in the synthesis of uncoated metallic nanoparticles.

The metallic nanoparticle cores produced are desirably in the nanometer size range. For example, in embodiments, the metallic nanoparticle cores have an average particle size or diameter of from about 1 to about 1000 nm, such as from about 50 to about 500 nm, or about 100 to about 200 nm, or about 2 to about 20 nm. Herein, "average" particle size is typically represented as $d_{50}$, or defined as the median particle size value at the $50^{th}$ percentile of the particle size distribution, wherein 50% of the particles in the distribution are greater than the $d_{50}$ particle size value, and the other 50% of the particles in the distribution are less than the $d_{50}$ value. Average particle size can be measured by methods that use light scattering technology to infer particle size, such as Dynamic Light Scattering. The particle diameter refers to the length of the pigment particle as derived from images of the particles generated by Transmission Electron Microscopy.

The size of the nanoparticle cores formed may be controlled by changing the irradiation time and intensity, the metal counter-ion, modifying the concentration of the metal ion and/or the photoinitiator, or by other means.

The metallic nanoparticle cores may be in any shape. Exemplary shapes of the metallic nanoparticle cores can include, without limitation, needle-shape, granular, globular, spherical, amorphorous shapes, and the like.

Once prepared, the uncoated metallic nanoparticle cores may be suspended in the solution, such as an aqueous solution, in which they are formed. Further, if desirable or necessary, the uncoated metallic nanoparticle cores may be stabilized, although stabilization can change the final properties of the particles, and thus stabilization is desirably avoided.

Synthesis of the Shells on the Metallic Nanoparticle Cores

After the core particles are formed, a shell is formed over the core to provide the bimetallic core-shell nanoparticles. Various methods can be used to form the shells, and will be described below.

The second metal material that forms the shell can be any suitable metal that will provide the desired properties, such as conductivity, and the like. Suitable second metal materials thus include copper, aluminum, magnesium, manganese, zinc, chromium, lead, cadmium, cobalt, nickel, gold, silver, platinum, tin, palladium, indium, iron, tungsten, molybdenum, ruthenium, bismuth, other suitable elemental metals, and mixtures thereof. As used herein, the shell is described as formed of a second "metal material" to clearly indicate that the shell can be of a single elemental metal, such as gold, silver, platinum, or the like, or it can be a mixture or alloy of two or more different metals.

In some embodiments, the first and second metals are different. For example, in these embodiments, copper can be used as a core material in view of its low cost, while precious metals can be used as a shell material in view of their high conductivity properties. Such combination allow for core-shell nanoparticles that can be produced at low cost but with desirable properties.

One method for forming the shell on the core particles is to photochemically produce the shell in situ over the formed core particles. This can be accomplished by repeating the core particle formation process in the core particle solution by adding, additional reactants to conduct reduction of one or more additional metallic ions with a reducing agent. In this method, the formed core particles act as seeds for the deposition of a layer of the second metal material, resulting in the formation of bimetallic core-shell particles.

In this method, any of the above-described metal materials can be provided by using the described metal ions, reducing agents, and the like. In embodiments of this method, the aqueous solution of metallic nanoparticle cores, second metal material precursor, and the reducing agent are again irradiated as described above. This results in the synthesis of bimetallic core-shell nanoparticles. The shell thickness may range from about 1 to about 1000 nm, such as from about 50 to about 500 nm, or about 100 to about 200 nm, or about 2 to about 20 nm.

As with the core particles themselves, the thickness of the nanoparticle shell formed may be controlled by changing the irradiation time and intensity, the metal counter-ion, modifying the concentration of the metal ion and/or the photoinitiator, or by other means.

Another method for forming the shell on the core particles is to separately prepare a solution or suspension of smaller metallic nanoparticles of the second metal, and mix the solution or suspension of smaller metallic nanoparticles and the metallic nanoparticle. The mixing results in the smaller metallic nanoparticles forming a coating or shell around the larger nanoparticle cores.

In embodiments, the solution or suspension of smaller metallic nanoparticles of the second metal can be prepared separately by photochemically producing the particles in the same manner as described above for producing the core particles. Of course, the reactants and conditions are selected to provide particles of the desired smaller particle size. In this method, any of the above-described metal materials can be provided by using the described metal ions, reducing agents, and the like. In embodiments, the small particles have an average particle size of less than about 100 nm, or less than 10 nm. In further embodiments, the small particles have an average particle size of from about 1 nm to about 50 nm, or from about 1 nm to about 10 nm, or from about 1 nm to about 5 nm In the mixing step, the large metallic nanoparticle cores and the smaller metallic nanoparticle shell particles can be mixed in any desired ratio, to provide the desired shell thickness. For example, a mixing ratio can be from about 9 parts by weight large metallic nanoparticle cores and about 1 part by weight smaller metallic nanoparticle shell particles, to about 1 part by weight large metallic nanoparticle cores and about 1 parts by weight smaller metallic nanoparticle shell particles. In other embodiments, the shell can be made even thicker, such as having a mixing ratio of from about 1 parts by weight large metallic nanoparticle cores and about 1 part by weight smaller metallic nanoparticle shell particles, to about 1 part by weight large metallic nanoparticle cores and about 5 parts by weight smaller metallic nanoparticle shell particles. Of course, it will be apparent that ratios outside this range can be used, for example to account for different metal densities and the like.

The final bimetallic core-shell nanoparticles produced are desirably in the nanometer size range. For example, in embodiments, the bimetallic core-shell nanoparticles have an average particle size or diameter of from about 1 to about 1000 nm, such as from about 50 to about 500 nm, or about 100 to about 200 nm, or about 2 to about 20 nm. Herein, "average" particle size is typically represented as $d_{50}$, or defined as the median particle size value at the $50^{th}$ percentile of the particle size distribution, wherein 50% of the particles in the distribution are greater than the $d_{50}$ particle size value, and the other 50% of the particles in the distribution are less than the $d_{50}$ value. Average particle size can be measured by methods that use light scattering technology to infer particle size, such as Dynamic Light Scattering. The particle diameter refers to the length of the pigment particle as derived from images of the particles generated by Transmission Electron Microscopy.

Accordingly, by varying the method of forming the shell layer, the physical structure of the shell can be adjusted. The shell layer can include a thin continuous layer of the second metal material, such as by using the first method described above of a second photochemical synthesis in the aqueous medium of formed nanoparticle cores, or the shell layer can include a layer of discrete smaller particles covering the nanoparticle cores, such as by using the second method described above of mixing preformed solutions or suspensions of relatively larger nanoparticle cores and relatively smaller nanoparticle shell particles. Either or both of these designs enable the shell to protect the core particle from oxidation, such as where the core particle is relatively small, such as less than about 100 nm or less than about 50 nm in average particle diameter.

The actual and relative sizes of the nanoparticle cores and shells affect the manner in which the bimetallic core-shell nanoparticles anneal. For example, it is known that as the size of the nanoparticles increases, the sintering time and temperature also increase. Where the bimetallic core-shell nanoparticles include a relatively small diameter core and relatively thin shell, the entire bimetallic core-shell nanoparticle can anneal, resulting in a conductive line that is essentially a mixture or alloy of the core and shell metal materials. However, in embodiments where the bimetallic core-shell nanoparticles include a relatively large diameter core and relatively thin shell, the nanoparticle core can remain intact while the shell layer undergoes annealing, resulting in a conductive line that includes the nanoparticle cores interconnected by connections or a matrix of the shell metal material. Thus, the core size and shell thickness, as well as the constituent metal materials can be adjusted to meet the desired level of conductivity, sintering temperature and time, cost, and the like.

The formed bimetallic core-shell nanoparticles can be used in any of a variety of applications, where particles are desired that can be annealed at lower temperatures to form conductive structures. For example, the bimetallic core-shell nanoparticles can be dispersed in an appropriate vehicle for formulation into an ink that can be printed on a substrate and subsequently annealed.

Once prepared, the bimetallic core-shell nanoparticles may be suspended in an aqueous solution, or they can be retained in the solution or suspension in which they were formed. In embodiments where the bimetallic core-shell nanoparticles are maintained in the medium in which they were formed, the nanoparticles can be readily formulated into an ink composition.

If desired or necessary for a particular purpose, the formed bimetallic core-shell nanoparticles may be functionalized by any suitable means known in the art. Moreover, the bimetallic core-shell nanoparticles may also or alternatively be stabilized. Stabilization of the particles may be achieved by adding stabilizing molecules directly to the aqueous solution containing the nanoparticles. Alternatively, the nanoparticles can be extracted into an organic solvent containing the stabilizing molecules. For example, copper coated nanoparticles may be stabilized with a substituted dithiocarbonate. In another example, silver coated nanoparticles may be stabilized with organic acids or amines, such as oleic acid or oleylamine. In another example, gold coated nanoparticles capped with alkylthiol can be used. Other suitable stabilizers for use according to the present disclosure generally include, without limitation, organic stabilizers. The term "organic" in "organic stabilizer" refers to, for example, the presence of carbon atom(s), but the organic stabilizer may include one or more non-metal heteroatoms such as nitrogen, oxygen, sulfur, silicon, halogen, and the like. Examples of other organic stabilizers may include, for example, thiol and its derivatives, —OC(=S)SH (xanthic acid), dithiocarbonates, polyethylene glycols, polyvinylpyridine, polyninylpyrolidone, alkyl xanthate, ether alcohol based xanthate, amines, and other organic surfactants. The organic stabilizer may be selected from the group consisting of a thiol such as, for example, butanethiol, pentanethiol, hexanethiol, heptanethiol, octanethiol, decanethiol, and dodecanethiol; a dithiol such as, for example, 1,2-ethanedithiol, 1,3-propanedithiol, and 1,4-butanedithiol; or a mixture of a thiol and a dithiol. The organic stabilizer may be selected from the group consisting of a xanthic acid such as, for example, O-methylxanthate, O-ethylxanthate, O-propylxanthic acid, O-butylxanthic acid, O-pentylxanthic acid, O-hexylxanthic acid, O-heptylxanthic acid, O-octylxanthic acid, O-nonylxanthic acid, O-decylxanthic acid, O-undecylxanthic acid, O-dodecylxanthic acid and combinations thereof.

Formulating the Metallic Nanoparticles into an Ink

The bimetallic core-shell nanoparticles can be formulated into inks, such as inks used in conventional pens, markers, liquid ink jet ink compositions, and the like. For example, the metallic nanoparticles can be formulated into a variety of ink vehicles, including solvent-based liquid inks, and even aqueous inks.

The ink composition according to the present disclosure generally includes bimetallic core-shell nanoparticles and an ink vehicle, such as a carrier solvent, or a mixture of two or more carrier solvents.

Generally, suitable solvent or carrier media can be polar or non-polar. Solvents that are useful according to the present disclosure include, without limitation, amines, amides, alcohols, terpene alcohols, esters, water, ketones, ethers, aromatics, substituted aromatics, terpenes, essential oils, aldehydes, alkenes, unsaturated hydrocarbons, saturated hydrocarbons, mineral acids, organic acids and bases. Other suitable solvents include, without limitation, N,N,-dimethylacetamide, diethyleneglycol butylether, ethanolamine and N-methylpyrrolidone, dichloromethane, methyl ethyl ketone, toluene, ketones, benzene, chlorotoluene, nitrobenzene, dichlorobenzene, N-methylpyrrolidinone, A dimethylacetamide, ethylene glycol, diethylene glycol, diethylene glycol butyl ether and propylene glycol.

The solvent can be a high melting point solvent, such as one having a melting point of at least about 30° C. and not greater than about 100° C. A heated inkjet head can be used to deposit the bimetallic core-shell nanoparticles ink composition while in a flowable state, whereby the solvent solidifies upon contacting the substrate. Subsequent processing can then remove the solvent by other means and then convert the material to the final product, thereby retaining resolution. Suitable solvents include waxes, high molecular weight fatty acids, alcohols, acetone, N-methyl-2-pyrrolidone, toluene, tetrahydrofuran, and the like. Alternatively, the bimetallic core-shell nanoparticles ink composition may be a liquid at room temperature, where the substrate is kept at a lower temperature below the freezing point of the composition.

The solvent can also be a low melting point solvent. A low melting point is required when the precursor composition must remain as a liquid on the substrate until dried. A suitable low melting point solvent is N,N,-dimethylacetamide, which has a melting point of about −20° C.

In addition, the solvent can be a low vapor pressure solvent. A lower vapor pressure advantageously prolongs the work life of the composition in cases where evaporation in the ink-jet head, syringe or other tool leads to problems such as clogging. Suitable solvents for this purpose include terpineol, diethylene glycol, ethylene glycol, hexylene glycol, N-methyl-2-pyrrolidone, and tri(ethylene glycol) dimethyl ether.

The solvent can also be a high vapor pressure solvent, such as one having a vapor pressure of at least about 1 kPa. A high vapor pressure allows rapid removal of the solvent by drying. High vapor pressure solvents include acetone, tetrahydrofuran, toluene, xylene, ethanol, methanol, 2-butanone and water.

To formulate the ink, about 0.5 to about 95 weight % of the bimetallic core-shell nanoparticles may be dispersed in an ink vehicle such as from about 1 to about 50 weight % or from about 5 to about 25 weight % or from about 10 to about 20 weight %. In an embodiment, about 20 weight %. In embodiments, conductivity is improved about 10× to about 35× or about 15× to about 20×.

The viscosity of the ink may be from about 1 centipoise to about 100 centipoise, such as from about 10 centipoise to about 75 centipoise, or from about 20 centipoise to about 50 centipoise, or from about 5 centipoise to about 12 centipoise. Here, viscosity is measured at 25° C.

Carrier Material

The ink composition also includes a carrier material, or a mixture of two or more carrier materials. The carrier material may vary depending upon the specific type of ink composition. For example, an aqueous ink jet ink composition can use water, or a mixture of water and one or more other solvents, as a suitable carrier material. Other ink jet ink compositions can use one or more organic solvents as a carrier material, with or without water.

Colorants

Any desired or effective colorant can be employed in the ink compositions, including pigment, dye, mixtures of pigment and dye, mixtures of pigments, mixtures of dyes, and the like. The bimetallic core-shell nanoparticles may also, in embodiments, impart some or all of the colorant properties to the ink composition. The ink according to the present disclosure may be produced as a colored ink by adding a colorant during the formulating the nanoparticles into an ink step.

Suitable colorants for use in the ink according to the present disclosure include, without limitation, carbon black, lamp black, iron black, ultramarine, Nigrosine dye, Aniline Blue, Du Pont Oil Red, Quinoline Yellow, Methylene Blue Chloride Phthalocyanine Blue, Phthalocyanine Green, Rhodamine 6C Lake, Chrome Yellow, quinacridone, Benzidine Yellow, Malachite Green, Hansa Yellow G, Malachite Green hexylate, oil black, azo oil black, Rose Bengale, monoazo pigments, disazo pigments, trisazo pigments, tertiary ammonium salts, metallic salts of salicylic acid and salicylic acid derivatives, and mixtures thereof. Examples of the coloring agent may include, for example, Fast Yellow G, Hansa Brilliant Yellow 5GX, Disazo Yellow AAA, Naphthol Red HFG, Lake Red C, Benzimidazolone Carmine HF3C, Dioxazine Violet, Phthalocyanine Blue, Phthalocyanine Green, Benzimidazolone Brown HFR, carbon black, Aniline Black, titanium oxide, Tartrazine Lake, Rhodamine 6G Lake, Methyl Violet Lake, Basic 6G Lake, Brilliant Green lakes, Nigrosine, and the like.

Examples of a yellow coloring agent for use may be, without limitation, Chrome Yellow, Benzidine Yellow, Hansa Yellow, Naphtol Yellow, and Quinoline Yellow; examples of a magenta coloring agent include Rhodamine 6G Lake, Watching Red, Rose Bengale, and Rhodamine B; and examples of a cyan coloring agent include Phthalocyanine Blue, Methylene Blue, Victoria Blue, Aniline Blue, Ultramarine Blue, and the like.

The amount of colorant can vary over a wide range, for instance, from about 3 to about 20 weight percent, and combinations of colorants may be used.

Additional Additives

The ink according to the present disclosure may further contain one or more additives for their known purposes. For example, suitable additives include, a fluidization agent such as colloidal silica; lubricants such as metal salts of fatty acids; wax, surfactants, silica; a spacing agent; a dryer; a dispersant; a humectant; a cross-linking agent; a stabilizer; a thickening agent; a gelatinizing agent; a defoaming agent; and an initiator for photopolymerization. It is worth noting however, that additional additives, if not removed in the annealing step, may reduce the conductivity of the conductive feature.

One or more waxes may be added to the ink in order to raise the image density and to effectively prevent the offset to a reading head and the image smearing. The wax can be present in an amount of, for example, from about 0.1 to about 10 weight percent or in an amount of from about 1 to about 6 weight percent based on the total weight of the ink composition. Examples of suitable waxes include, but are not limited to, polyolefin waxes, such as low molecular weight polyethylene, polypropylene, copolymers thereof and mixtures thereof. Other examples include a polyethylene wax, a polypropylene wax, a fluorocarbon-based wax (TEFLON®), or Fischer-Tropsch wax, although other waxes can also be used. The wax may, for example, help prevent offset to a reading head and image smearing.

The ink compositions can also optionally contain an antioxidant. The optional antioxidants of the ink compositions protect the images from oxidation and also protect the ink components from oxidation during the heating portion of the ink preparation process. Specific examples of suitable antioxidants include NAUGUARD® series of antioxidants, such as NAUGUARD® 445, NAUGUARD® 524, NAUGUARD® 76, and NAUGUARD® 512 (commercially available from Uniroyal Chemical Company, Oxford, Conn.), the IRGANOX® series of antioxidants such as IRGANOX® 1010 (commercially available from Ciba Geigy), and the like. When present, the optional antioxidant can be present in the ink in any desired or effective amount, such as in an amount of from at least about 0.01 to about 20 percent by weight of the ink, such as about 0.1 to about 5 percent by weight of the ink, or from about 1 to about 3 percent by weight of the ink, although the amount can be outside of these ranges.

The ink compositions can also optionally contain a viscosity modifier. Examples of suitable viscosity modifiers include aliphatic ketones, such as stearone, and the like. When present, the optional viscosity modifier can be present in the ink in any desired or effective amount, such as about 0.1 to about 99 percent by weight of the ink, such as about 1 to about 30 percent by weight of the ink, or about 10 to about 15 percent by weight of the ink, although the amount can be outside of these ranges.

Other optional additives to the inks include clarifiers, such as UNION CAMP® X37-523-235 (commercially available from Union Camp); tackifiers, such as FORAL® 85, a glycerol ester of hydrogenated abietic (rosin) acid (commercially available from Hercules), FORAL® 105, a pentaerythritol ester of hydroabietic (rosin) acid (commercially available from Hercules), CELLOLYN® 21, a hydroabietic (rosin) alcohol ester of phthalic acid (commercially available from Hercules), ARAKAWA® KE-311 Resin, a triglyceride of hydrogenated abietic (rosin) acid (commercially available from Arakawa Chemical Industries, Ltd.); synthetic polyterpene resins such as NEVTAC® 2300, NEVTAC® 100, and NEVTAC® 80 (commercially available from Neville Chemical Company), WINGTACK® 86, a modified synthetic polyterpene resin (commercially available from Goodyear), and the like; adhesives, such as VERSAMID® 757, 759, or 744 (commercially available from Henkel); plasticizers, such as UNIPLEX® 250 (commercially available from Uniplex), the phthalate ester plasticizers commercially available from Monsanto under the trade name SANTICIZER®, such as dioctyl phthalate, diundecyl phthalate, alkylbenzyl phthalate (SANTICIZER® 1278), triphenyl phosphate (commercially available from Monsanto), KP-140®, a tributoxyethyl phosphate (commercially available from FMC Corporation), MORFLEX® 150, a dicyclohexyl phthalate (commercially available from Morflex Chemical Company Inc.), trioctyl trimellitate (commercially available from Eastman Kodak Co.), and the like; and the like. Such additives can be included in conventional amounts for their usual purposes.

Surfactants

Examples of nonionic surfactants that may be used in the ink according to the present disclosure include, without limitation, polyvinyl alcohol, polyacrylic acid, methalose, methyl cellulose, ethyl cellulose, propyl cellulose, hydroxy ethyl cellulose, carboxy methyl cellulose, polyoxyethylene cetyl ether, polyoxyethylene lauryl ether, polyoxyethylene octyl ether, polyoxyethylene octylphenyl ether, polyoxyethylene oleyl ether, polyoxyethylene sorbitan monolaurate, polyoxyethylene stearyl ether, polyoxyethylene nonylphenyl ether, dialkylphenoxypoly(ethyleneoxy)ethanol, and the like, and mixtures thereof. A suitable concentration of the nonionic surfactant is, for example, from about 0.01 to about 10 percent by weight, and in some embodiments in an amount of about 0.1 to about 5 percent by weight.

Examples of suitable cationic surfactants include, without limitation, alkylbenzyl dimethyl ammonium chloride, dialkyl benzenealkyl ammonium chloride, lauryl trimethyl ammonium chloride, alkylbenzyl methyl ammonium chloride, alkyl benzyl dimethyl ammonium bromide, benzalkonium chloride, cetyl pyridinium bromide, $C_{12}$, $C_{15}$, $C_{17}$-trimethyl ammonium bromides, halide salts of quaternized polyoxyethylalkylamines, dodecylbenzyl triethyl ammonium chloride, and the like, and mixtures thereof. A suitable amount of surfactant can be selected, such as in an amount of about 0.1 to about 10 percent by weight, and in some embodiments in an amount of about 0.2 to about 5 percent by weight. The choice of particular surfactants or combinations thereof as well as the amounts of each to be used are within the purview of those skilled in the art. In embodiments, the surfactant may participate in the formation of metal nanoparticles by acting as a source of photochemically produced reducing radicals.

Further, fatty acids, olefin-maleic acid anhydride copolymers and the like, may be added to the ink in order to protect the photosensitive member and to obtain toner images having high quality without deterioration of developing property.

Preparation of Ink

The ink compositions of the present disclosure can be prepared by any desired or suitable method. In the case of liquid ink compositions, the ink ingredients can simply be mixed together with stirring to provide a homogeneous composition, although heating can also be used if desired or necessary to help form the composition. Other methods for making ink compositions are known in the art and will be apparent based on the present disclosure.

The ink according to the present disclosure may be, for example, an aqueous ink, an oil ink, a solvent-based ink, and the like.

The ink may be produced by any known method blending the above mentioned components, melting with kneading the mixture and pulverizing the resultant mass. Moreover, it may be produced by a polymerization method which comprises blending monomers for the binder with other ingredients and polymerizing the mixture.

Printing of the Ink

The ink according to the present disclosure may generally be printed on a suitable substrate such as, without limitation, paper, glass art paper, bond paper, paperboard, Kraft paper, cardboard, semi-synthetic paper or plastic sheets, such as polyester or polyethylene sheets, and the like. These various substrates can be provided in their natural state, such as uncoated paper, or they can be provided in modified forms, such as coated or treated papers or cardboard, printed papers or cardboard, and the like.

For printing the ink of the present disclosure on a substrate, any suitable printing method may be used. For example, suitable methods include, without limitation, roll-to-roll high volume analog printing methods, such as gravure, rotogravure, flexography, lithography, etching, screenprinting, and the like. Additionally, thermography, electrophotography, electrography, laser induced transfer, inkjet printing, or a combination thereof may be used. If a laser induced transfer digital printing method is used, exemplary methods of such method are dye sublimation, ablation, melt transfer, or film transfer. The ink may also be used for a thermal transfer printer, a hot-melt printer and ordinary instrument for writing. In a particular embodiment, the method used is inkjet printing.

Annealing the Printed Ink

After printing the ink on a suitable substrate, annealing of the bimetallic core-shell nanoparticles in the ink to the substrate can be done by suitable means in the art. Generally, due at least in part to the presence of the shell in the bimetallic core-shell nanoparticles, the annealing can be conducted at lower temperature and in a short time. This allows the inks to be suitable used on substrates such as paper that may not otherwise be able to withstand the time and temperature required to anneal conventional metallic annealing procedures. For example, the annealing can be performed at a temperature of less than about 200° C. for about 30 min, or less than about 150° C. for about 10 min, or less than about 120° C. for about 10 minutes. The printing and annealing steps are generally performed in an ambient environment. Generally, an ambient environment refers to a normal atmospheric air environment, not requiring the presence of an inert gas environment. In addition, the printing and annealing steps can be performed simultaneously or consecutively.

Optionally, additional processing steps, such as any of overcoating, drying and rinsing, alone or in combination, may follow the printing step.

For the optional overcoating step, any suitable overcoating may be applied after the printing process is completed. For example, a suitable overcoating can be applied to cover and protect the printed metal wires, such as to protect them from abrasion, chemical attack, or the like. When so applied, the overcoating can be of any desired thickness, opacity, transparency, or the like.

Additionally, an optional drying step may follow the precipitation and deposition of the ink on the substrate. In some embodiments, the ink is allowed to dry for about 5 minutes at 80° C.

Applications of the Present Disclosure

The present disclosure offers many possible applications. The printing process of this disclosure may be used to manufacture electronic and electrical circuit systems, including electrical interconnects electronic components. Moreover, the printing process of this disclosure may be used to print electrical components, including resistors, capacitors, inductors, RFID tags, thin film transistor electrodes, as well as electric circuits. Additionally, the printing process of this disclosure may be used to print microwave strip line structures directly onto flexible substrates to form microwave integrated circuits (MICs), and microwave antennas. It should be noted that it is feasible to print any type of antenna with the process according to the present disclosure, including, for example, HF coils, UHF fan-shaped antennas, and fibers.

An example is set forth herein below and is illustrative of different compositions and conditions that can be utilized in practicing the disclosure. All proportions are by weight unless otherwise indicated. It will be apparent, however, that the disclosure can be practiced with many types of compositions and can have many different uses in accordance with the disclosure above and as pointed out hereinafter.

EXAMPLES

Example 1

A quartz cuvette containing 0.33 mM of a Cu (I or II) salt, $Cu(NO_3)_2$, and 1.0 mM of Irgacure 2959 (an α-hydroxyketone photoinitiator) is degassed with Ar for 5 min. The solution is irradiated for 15 s using a Fusion UV Lighthammer 6 exposure unit (typical output: UVB: 1.8 W/cm$^2$; UVA 1.9 W/cm$^2$), resulting in the formation of Cu core particles having an average particle diameter of 230 nm.

To this suspension of core particles is added an aqueous solution containing $HAuCl_4$ and Irgacure 2959, such that the final concentrations are 0.33 mM and ~1 mM respectively. This new solution is further irradiated for 15-90 s using the Fusion UV Lighthammer 6 exposure unit, which causes the suspended copper core particles to act as seeds for deposition of a layer of the gold metal, resulting in the formation of bimetallic core-shell particles. The resulting Cu/Ag core-shell particles are characterized by TEM. The particles are collected and re-suspended in a solvent suitable for ink-jet printing.

Example 2

A quartz cuvette containing 0.33 mM of a Cu (I or II) salt and 1.0 mM of Irgacure 2959 (an α-hydroxyketone photoinitiator) is irradiated for 10-60 s using a Fusion UV Lighthammer 6 exposure unit (typical output: UVB: 1.8 W/cm$^2$; UVA 1.9 W/cm$^2$), resulting in the formation of Cu core particles. In a separate quartz cuvette containing 0.33 mM HAuCl$_4$ and 1.0 mM Irgacure 2959 (an α-hydroxyketone photoinitiator) is irradiated for 10-90 s using the Fusion UV Lighthammer 6 exposure unit, resulting in the formation of smaller sized gold particles. The particles are collected by centrifugation and re-suspended together in xylene in about a 9:1 ratio of core to shell. The particles form bimetallic core-shell nanoparticles of copper cores surrounded by a layer of gold particles.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A method of forming bimetallic core-shell metal nanoparticles comprising a core of a first metal material and a shell of a second metal material, the method comprising:
    photochemically producing metallic nanoparticle cores of the first metal material; and
    forming a shell of the second metal material around the cores,
    wherein the shell is formed by a method comprising:
        separately photochemically producing metallic nanoparticles of the second metal material, wherein the metallic nanoparticles of the second metal material have a smaller average particle size than the metallic nanoparticle cores; and
        mixing the metallic nanoparticles of the second metal material and the metallic nanoparticle cores to cause the metallic nanoparticles of the second metal material to form a shell around the metallic nanoparticle cores.

2. The method of claim 1, wherein the first metal material and second metal material are independently selected from the group consisting of copper, aluminum, magnesium, manganese, zinc, chromium, lead, cadmium, cobalt, nickel, gold, silver, platinum, tin, palladium, indium, iron, tungsten, molybdenum, ruthenium, bismuth, mixtures thereof, and alloys thereof.

3. The method of claim 2, wherein the first metal material and second metal material are different.

4. The method of claim 2, wherein the first metal material is copper and the second metal is selected from the group consisting of gold, silver, platinum, palladium, mixtures thereof, and alloys thereof.

5. The method according to claim 1, wherein the step of photochemically producing the metallic nanoparticle cores comprises:
    mixing a metal salt and a reducing agent in a solvent medium to form a solution or suspension, and
    irradiating the solution or suspension to cause the formation of the metallic nanoparticle cores.

6. The method according to claim 5, wherein the metal salt is a sulfate, halide, nitrate, acetate, formate, phosphate, acetylacetonate, carbonate, or a mixture thereof.

7. The method according to claim 5, wherein the reducing agent is produced by a Norrish Type I cleavage process or a Norrish Type II photoinitiation process.

8. The method according to claim 5, wherein the reducing agent is a radical.

9. The method according to claim 8, wherein the radical is a ketyl radical.

10. The method according to claim 5, wherein the solvent medium is an aqueous medium.

11. The method according to claim 5, wherein the solution or suspension is deaerated.

12. The method according to claim 1, wherein the bimetallic core-shell metal nanoparticles have an average diameter of about 1 nm to about 1000 nm.

13. The method according to claim 1, wherein the shells protect the metallic nanoparticle cores from oxidation.

14. The method according to claim 1, wherein the second metal material anneals at a temperature of less than about 120° C., but the first metal material does not anneal at a temperature of less than about 120° C.

15. The method according to claim 1, wherein both the first and second metal materials anneal at a temperature of less than about 120° C.

16. A method of forming an ink, comprising:
    forming bimetallic core-shell metal nanoparticles by the method of claim 1, and
    formulating the bimetallic core-shell metal nanoparticles into an ink.

17. The method of claim 16, wherein formed bimetallic core-shell metal nanoparticles are extracted from solvent or suspension into an ink vehicle.

18. The method of claim 16, wherein the ink is an inkjet ink.

* * * * *